(12) United States Patent
Li et al.

(10) Patent No.: US 11,798,781 B2
(45) Date of Patent: Oct. 24, 2023

(54) MICROSCOPE

(71) Applicant: FOCUS-EBEAM TECHNOLOGY (BEIJING) CO., LTD., Beijing (CN)

(72) Inventors: Shuai Li, Beijing (CN); Wei He, Beijing (CN)

(73) Assignee: FOCUS-EBEAM TECHNOLOGY (BEIJING) CO., LTD., Beijing (CN)

( * ) Notice: Subject to any disclaimer, the term of this patent is extended or adjusted under 35 U.S.C. 154(b) by 247 days.

(21) Appl. No.: 17/420,707

(22) PCT Filed: Sep. 15, 2020

(86) PCT No.: PCT/CN2020/115424
§ 371 (c)(1),
(2) Date: Jul. 5, 2021

(87) PCT Pub. No.: WO2021/103751
PCT Pub. Date: Jun. 3, 2021

(65) Prior Publication Data
US 2022/0108870 A1    Apr. 7, 2022

(30) Foreign Application Priority Data

Jun. 3, 2020 (CN) .......................... 202010494563.6

(51) Int. Cl.
*H01J 37/285* (2006.01)
*H01J 37/20* (2006.01)
*H01J 37/28* (2006.01)

(52) U.S. Cl.
CPC ............ *H01J 37/285* (2013.01); *H01J 37/20* (2013.01); *H01J 37/28* (2013.01)

(58) Field of Classification Search
CPC .......... H01J 37/00; H01J 37/02; H01J 37/285; H01J 37/20; H01J 37/26; H01J 37/28; H01J 37/261; G21K 7/00
(Continued)

(56) References Cited

U.S. PATENT DOCUMENTS

| 10,746,672 B2 | 8/2020 | Filevich |
| 2018/0033589 A1* | 2/2018 | Schamber ............... H01J 37/20 |

(Continued)

FOREIGN PATENT DOCUMENTS

| CN | 109148245 A | 1/2019 |
| CN | 109243947 A | 1/2019 |
| CN | 212062378 U | 12/2020 |

OTHER PUBLICATIONS

Zhao, W.X. et al. "A true-color nano-CT based on SEM" 9th Internarional Sympesiam en Advanced Oprical Manufacturing and Testing Technologies: Subdifraction-Limited Plasmonic Lithography and Inevarive Manufacturing Technology, vol. 10842, Feb. 6, 2019 (Feb. 6, 2019), ISSN: 0277-786X, p. 108420P-3 and 108420P-4, figures 2 and 4.

(Continued)

*Primary Examiner* — Jason L McCormack
(74) *Attorney, Agent, or Firm* — SYNCODA LLC; Feng Ma

(57) ABSTRACT

A microscope includes: an electronic optical column configured to emit scanning electron beams; a specimen stage configured to place a specimen; a target movably disposed between the electronic optical column and the specimen stage; and a driving mechanism for driving the target to move between a first position and a second position, wherein the first position is a position at which the electron beams act on the specimen, and the second position is a position at which the electron beams act on the target to generate X-rays irradiating the specimen. In the present disclosure, through one time mounting of the specimen, the microscope enables the dual-function detection of the specimen, i.e., detection of the specimen by an SEM and detection of the specimen by a Nano-CT.

7 Claims, 2 Drawing Sheets

(58) Field of Classification Search
USPC .................................. 250/306, 307, 310, 311
See application file for complete search history.

(56) References Cited

U.S. PATENT DOCUMENTS

| | | | |
|---|---|---|---|
| 2018/0323032 A1* | 11/2018 | Strelec | H01J 35/186 |
| 2018/0366294 A1 | 12/2018 | Miyaoka | |
| 2019/0017942 A1 | 1/2019 | Filevich | |
| 2019/0311881 A1* | 10/2019 | Lavely | H01J 37/28 |
| 2020/0343070 A1* | 10/2020 | Safai | H05G 1/52 |
| 2021/0389262 A1* | 12/2021 | Aoyama | G01N 23/223 |

OTHER PUBLICATIONS

International Search Report in the international application No. PCT/CN2020/115424, dated Mar. 4, 2021.

* cited by examiner

MICROSCOPE

CROSS-REFERENCE TO RELATED APPLICATION

This application is a national stage of International Application No. PCT/CN2020/115424 filed on Sep. 15, 2020, which claims priority to Chinese patent application No. 202010494563.6 filed on Jun. 3, 2020. The disclosures of these applications are hereby incorporated by reference in their entirety.

TECHNICAL FIELD

The present disclosure belongs to the technical field of electronic devices, and particularly to a microscope.

BACKGROUND

A Scanning Electron Microscope (SEM) uses focused electron beams to scan a specimen, stimulates various physical information through the interaction between the electron beams and the specimen, and collects, amplifies and images these information to achieve the objective of characterizing the microscopic morphology of materials. The SEM is widely used in the field of observing the surface morphology of materials.

A nano X-ray microscope (Nano-CT) uses X-ray beams to scan a certain thickness of layer of a specimen, a detector receives the X-rays passing through this layer, after the X-rays are converted to visible light, the visible light is converted to an electric signal by means of photoelectric conversion, and the electric signal is processed by a computer to form a three-dimensional CT image. The CT image can reflect the geometrical information and structural information of the specimen. The geometrical information includes the size, volume and spatial coordinates of each point of the specimen. The structural information includes material information such as the attenuation value, density and porosity of the specimen.

In the prior art, when a specimen needs to be detected by both the SEM and the Nano-CT, the specimen needs to be placed in the SEM for detection and then placed in the Nano-CT for detection. Therefore, the detection efficiency is low, and the specimen has to be mounted on different corresponding specimen stages, which poses a risk of damage of the specimen.

Based on the above, the present disclosure is proposed.

SUMMARY

The technical problem to be solved by the present disclosure is to overcome the defects of the prior art and provide a microscope, which enables dual-function detection of a specimen, i.e., detection of the specimen by an SEM and detection of the specimen by a Nano-CT, through one-time mounting of the specimen.

In order to solve the above technical problem, the basic concept of the technical solution adopted by the present disclosure is as follows: a microscope includes:
 an electronic optical column configured to emit scanning electron beams;
 a specimen stage configured to place a specimen;
 a target movably disposed between the electronic optical column and the specimen stage; and
 a driving mechanism for driving the target to move between a first position and a second position, wherein the first position is a position at which the electron beams act on the specimen, and the second position is a position at which the electron beams act on the target to generate X-rays irradiating the specimen.

Further, the microscope may further include a first deflection device, the first deflection device is disposed between the electronic optical column and the target and is configured to change a direction of movement of the electron beam before the electron beams are incident on the target.

Further, the microscope may further include a mounting base, the mounting base is provided with at least one mounting position, and each mounting position is configured to mount a respective different target.

Further, the first deflection device is connected to the mounting base, and the mounting base is connected to the driving mechanism.

In some optional implementation manners, the mounting base is provided with a cooling pipeline configured to cool the target.

In some optional implementation manners, an X-ray detector is disposed below the specimen stage.

In some optional implementation manners, a lower end of the electronic optical column is connected with a vacuum chamber, the specimen stage is located in the vacuum chamber, and the specimen stage is disposed below the electronic optical column.

Further, the vacuum chamber is provided with a vacuum window corresponding to the lower side of the specimen stage.

Further, an X-ray detector is disposed below the vacuum window.

In some optional implementation manners, the specimen stage is connected to the vacuum chamber through a lifting mechanism so as to drive the specimen stage to move up and down in the vacuum chamber.

By adopting the above technical solution, compared with the prior art, the present disclosure has the following beneficial effects:

In the microscope provided by the present disclosure, by disposing a movable target between the electronic optical column and the specimen stage, the scanning electron beams emitted by the electronic optical column may selectively directly act on a specimen, or act on the target to generate X-rays and the generated X-rays irradiate the specimen. According to the present disclosure, through one-time mounting of the specimen, it enables dual-function detection of the specimen, i.e., detection of the specimen by an SEM and detection of the specimen by a Nano-CT.

The specific implementation manner of the present disclosure will be further described in detail below with reference to the drawings.

BRIEF DESCRIPTION OF THE DRAWINGS

As a part of the present disclosure, the drawings are used to provide a further understanding of the present disclosure. The exemplary embodiments of the present disclosure and the description thereof are used to explain the present disclosure, and do not constitute an improper limitation on the present disclosure. It is apparent that the drawings in the following description are only some embodiments. Those skilled in the art can also obtain other drawings according to these drawings without any creative work. In the drawings.

In the figures.

1. electronic optical column; 101. electron source; 102. second deflection device; 103. objective lens system;

2. mounting base; 3. driving mechanism; 4. cooling pipeline; 5. vacuum chamber; 6. first deflection device; 7. target; 8. specimen; 9. specimen stage; 10. lifting mechanism; 11. X-ray detector; 12. vacuum window.

It should be noted that these drawings and text descriptions are not intended to limit the conceptual scope of the present disclosure in any way, but are intended to explain the concept of the present disclosure for those skilled in the art by referring to specific embodiments.

DETAILED DESCRIPTION

In order to make the objectives, technical solutions and advantages of the embodiments of the present disclosure clearer, the technical solutions in the embodiments are clearly and completely described below with reference to the drawings in the embodiments of the present disclosure. The following embodiments are intended to illustrate the present disclosure, but are not intended to limit the scope of the present disclosure.

In the description of the present disclosure, it should be noted that the orientations or position relationships indicated by terms "upper", "lower", "front", "rear", "left", "right", "vertical", "inside", "outside" and the like are based on orientations or position relationships shown in drawings. These terms are only for the convenience of describing the present disclosure and simplifying the description, but do not indicate or imply that the specified device or component must have a specific orientation and must be constructed and operated in the specific orientation, so that it can not be understood as a limitation to the present disclosure.

In the description of the present disclosure, it should be noted that unless otherwise clearly specified and defined, the terms "mounting", "linking" and "connection" should be understood in a broad sense. For example, the connection may be fixed connection, detachable connection or integrated connection, may be mechanical connection or electrical connection, and may be direct connection or indirect connection through an intermediate. Those skilled in the art can understand the specific meanings of the above terms in the present disclosure according to specific situations.

Figure 1:
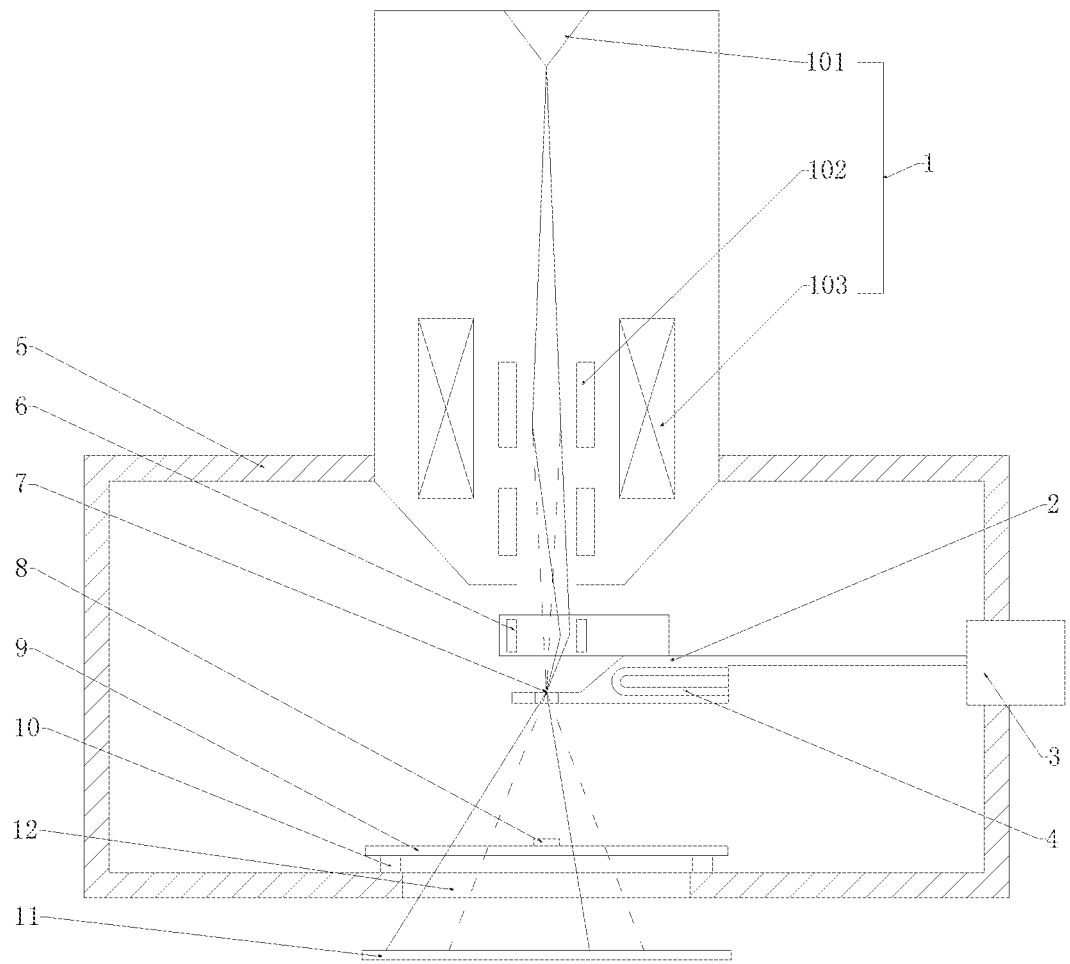
FIG. 1 is a schematic structural diagram of a microscope target at a second position according to the present disclosure.
Figure 2:
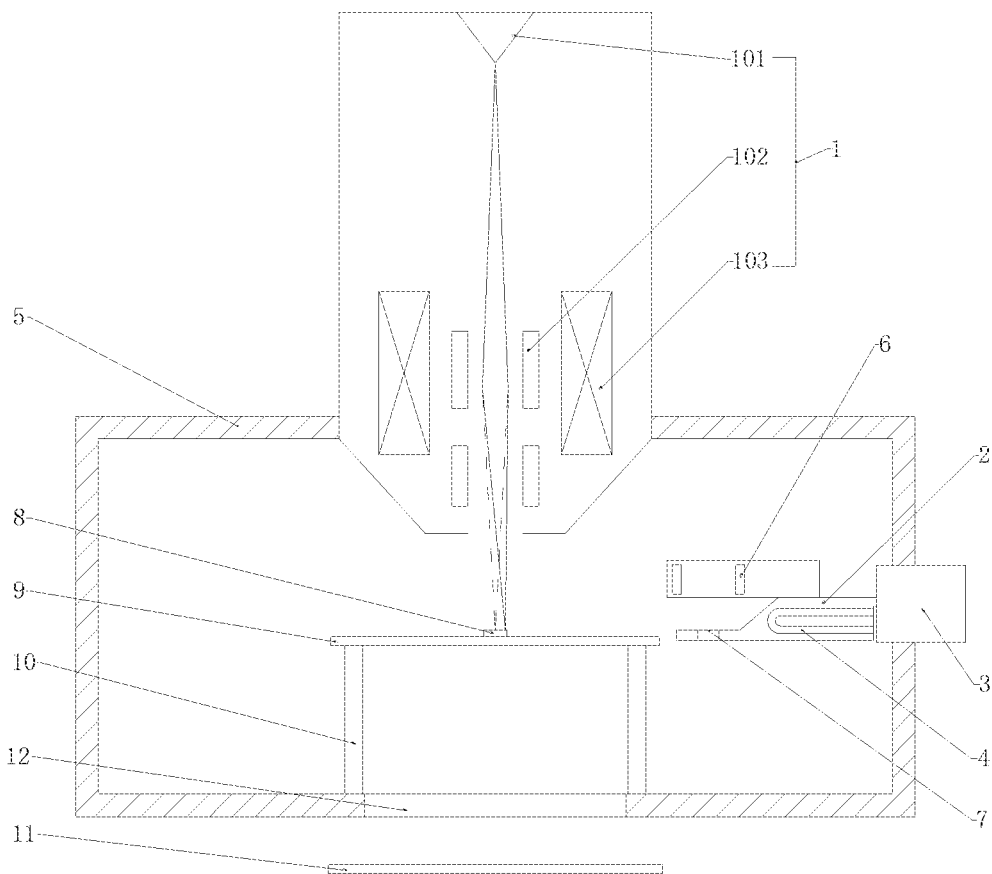
FIG. 2 is a schematic structural diagram of a microscope target at a first position according to the present disclosure.

As shown in FIG. 1 and FIG. 2, a microscope provided by the present disclosure includes an electronic optical column 1, a specimen stage 9, a target 7, and a driving mechanism 3.

The electronic optical column 1 is configured to emit scanning electron beams, the specimen stage 9 is configured to place a specimen 8, the target 7 is movably disposed between the electronic optical column 1 and the specimen stage 9, the driving mechanism 3 is configured to drive the target 7 to move between a first position and a second position, the first position is a position at which the electron beams act on the specimen 8, and the second position is a position at which the electron beams act on the target 7 to generate X-rays irradiating the specimen 8.

When the driving mechanism 3 drives the target 7 to move to the first position, the scanning electron beams emitted by the electronic optical column 1 can directly act on the specimen 8, so as to realize the detection of the specimen 8 by an SEM.

When the driving mechanism 3 drives the target 7 to move to the second position, the scanning electron beams emitted by the electronic optical column 1 can act on the target 7 to generate X-rays, the generated X-rays irradiate the specimen 8, and an X-ray detector 11 is disposed below the specimen stage 9, so as to realize the detection of the specimen 8 by a Nano-CT. The scanning electron beams emitted by the electronic optical column 1 can generate a beam spot with a very small diameter, so the X-ray microscope reaches the nano level.

By disposing the movable target 7 between the electronic optical column 1 and the specimen stage 9, the scanning electron beams emitted by the electronic optical column 1 can selectively directly act on the specimen 8 or act on the target 7 to generate X-rays, and the generated X-rays irradiate the specimen 8. In this way, though one-time mounting of the specimen 8, it enables dual-function detection of the specimen 8, i.e., detection of the specimen by an SEM and detection of the specimen by a Nano-CT.

It should be noted that the first position is a position at which the scanning electron beams emitted by the electronic optical column 1 cannot act on the target 7, but can act on the specimen 8, and the second position is a position at which the scanning electron beam emitted by the electronic optical column 1 can act on the target 7.

Specifically, the electronic optical column 1 is configured to generate electron beams and emit scanning electron beams. The electronic optical column 1 includes an electron source 101, an electron acceleration structure, and an objective lens system 103.

The electron source 101 is configured to generate and emit electron beams. The electron acceleration structure is an anode, which is configured to form an electric field along the emission direction of the electron beams to increase the speed of movement of the electron beam. The objective lens system 103 is configured to control the beam current size of the electron beams emitted by the electron source 101 and the forward direction of the electron beams.

The objective lens system 103 includes an objective lens and a second deflection device 102. The objective lens may be a magnetic lens, or an electric lens, or an electromagnetic compound lens. The second deflection device 102 may be a magnetic deflection device or an electric deflection device. The second deflection device 102 is configured to change the direction of movement of the electron beams emitted by the electron source 101, and can generate a scanning field in any deflection direction.

In some optional implementation manners, since the electron beams act on the target 7 to generate X-rays which generate heat, if the electron beams act on the target 7 for a long time, it results in a high local temperature at a point of action, which will easily cause loss to the target 7. The electronic optical column 1 includes a second deflection device 102. The action of the second deflection device 102 on the electron beams can change the direction of movement of the electron beams, the electronic optical column 1 can emit scanning electron beams, the electron beams act on the target 7 through scanning to generate X-rays, and the point at which the electron beams act on the target 7 is constantly changed, so as to avoid a high local temperature of the target 7, and prolong the service life of the target 7.

An optical axis of the electron beams generated by the electron source 101 is a main optical axis, and an included angle between the electron beams before being incident on the target 7 and the main optical axis is an incident angle.

The electronic optical column 1 includes an objective lens, and the objective lens is configured to control the beam current size of the electron beams. In order to ensure that the electron beams are incident on the target 7 to generate more concentrated X-rays, the electron beams need to be focused through the objective lens, so that the beam spot of the electron beams acts on the target 7.

Since the second deflection device 102 is disposed in front of the objective lens, under the condition that the distance between the target 7 and the electronic optical column 1 is not changed, the incident angle can be adjusted in a limited range if it is to ensured that the beam spot of the electron beam acts on the target 7. Otherwise, if the incident angle is too large, the beam spot of the electron beams will be located above the target 7, resulting in that the generated X-rays are not concentrated, and after the X-rays irradiate the specimen 8, the image of the Nano-CT produced by the specimen 8 has a large imaging aberration and is unclear.

In order to overcome the above problems, ensure clear imaging of the Nano-CT and reduce aberrations, the microscope provided by the present disclosure further includes a first deflection device 6, and the first deflection device 6 is disposed between the electronic optical column 1 and the target 7, and is configured to change the direction of movement of the electron beam before the electron beams are incident on the target. The first deflection device 6 may be a magnetic deflection device or an electric deflection device.

The electronic optical column 1 emits scanning electron beams which pass through the first deflection device 6, the first deflection device 6 changes the direction of movement of the scanning electron beams, and then, the scanning electron beams are incident on the target 7. Before the electronic optical column 1 emits the scanning electron beams which are incident on the target 7, the first deflection device 6 performs deflection adjustment on the scanning electron beams before being incident on the target 7. On the premise of ensuring that the beam spot of the electron beams act on the target 7, the incident angle can be adjusted in a larger range. The scanning electron beams can be incident on the target 7 with a larger incident angle, which is convenient for adjusting the scanning electron beams before being incident on the target 7, so as to ensure that the generated X-rays are concentrated. After the X-rays irradiate the specimen 8, the Nano-CT can image the specimen 8 clearly and can reduce aberrations.

In some optional implementation manners, the microscope provided by the present disclosure further includes a mounting base 2, the mounting base 2 is provided with at least one mounting position, and each mounting position is configured to mount a respective different target 7.

The target 7 is mounted on the mounting base 2, the mounting base 2 is provided with a plurality of mounting positions, each mounting position can be configured to mount one target 7, a plurality of mounting positions can be configured to mount targets 7 of different thicknesses or targets 7 of different materials, the scanning electron beams act on the targets 7 of different thicknesses or the targets 7 of different materials, and the generated X-rays have different solid angles and different strengths, so that different X-rays can be generated to irradiate the specimen 8.

The selection of the target 7 is determined according to the density of the specimen 8. If the density of the tested specimen 8 is higher, the X-rays are required to have a high hardness and a high ability to penetrate through an object, so an element with a high atomic number can be selected as the target 7. If the density of the tested specimen 8 is lower and the internal structure is looser, the X-rays are required to have a lower hardness and a lower ability to penetrate through an object, so an element with a lower atomic number can be selected as the target 7.

Optional targets 7 include: gold, tungsten, silver, rhodium, chromium, nickel and other elements with higher atomic numbers.

Those skilled in the art can select targets 7 of different thicknesses or different materials to be mounted on the corresponding mounting positions according to actual needs. When a target 7 is needed, the driving mechanism 3 is controlled to drive the needed target 7 to the second position, and the scanning electron beam acts on the needed target 7 to generate needed X-rays irradiating the specimen 8.

In some optional implementation manners, the mounting base 2 is provided with a cooling pipeline 4 configured to cool the target 7.

The mounting base 2 is provided with a cooling pipeline 4, a cooling liquid is introduced into the cooling pipeline 4, the cooling pipeline 4 is provided with a liquid inlet and a liquid outlet, and the cooling liquid enters from the liquid inlet to take away the heat of the target 7 and then flows out from the liquid outlet, so as to realize heat dissipation of the target 7 to prolong the service life of the target 7.

The cooling liquid may be a water-soluble cooling liquid, or an emulsion, or an oil base. Preferably, the cooling liquid is water.

In some optional implementation manners, the first deflection device 6 is connected to the mounting base 2, and the mounting base 2 is connected to the driving mechanism 3.

Specifically, the driving mechanism 3 may be a telescopic rod mechanism, or a hydraulic rod mechanism, or a rotating mechanism, or other mechanical structures which can drive the mounting base 2 to move or rotate.

The first deflection device 6 is disposed on the mounting base 2, the first deflection device 6 is connected to the mounting base 2, and the driving mechanism 3 is connected to the mounting base 2. Since the first deflection device 6 is connected to the mounting base 2, when the driving mechanism 3 drives the mounting base 2 to move, the first deflection device 6 is driven to move together, so that the driving mechanism 3 simultaneously drives the mounting base 2 and the first deflection device 6 to move.

In some optional implementation manners, this implementation manner may include two driving mechanisms 3, the first driving mechanism is connected to the mounting base 2, the first driving mechanism separately drives the mounting base 2 to move, the second driving mechanism is connected to the first deflection device 6, and the second driving mechanism separately drives the first deflection device 6 to move.

In some optional implementation manners, the first deflection device 6 is disposed on the mounting base 2, the first deflection device 6 is connected to the mounting base 2, and the driving mechanism 3 is connected to the first deflection device 6. Since the first deflection device 6 is connected to the mounting base 2, when the driving mechanism 3 drives the first deflection device 6 to move, the mounting base 2 is driven to move together, so that the driving mechanism 3 simultaneously drives the mounting base 2 and the first deflection device 6 to move.

As shown in FIG. 1 and FIG. 2, a microscope provided by the present disclosure sequentially includes an electronic optical column 1 from top to bottom, the lower end of the electronic optical column 1 is connected with a vacuum chamber 5, the specimen stage 9 is located in the vacuum chamber 5, and the specimen stage 9 is disposed below the electronic optical column 1. The specimen stage 9 is located in the vacuum chamber 5, a first deflection device 6 and a mounting base 2 are sequentially disposed between the electronic optical column 1 and the specimen stage 9, the mounting base 2 is provided with a target 7, the first deflection device 6 is connected to the mounting base 2, the driving mechanism 3 is connected to the mounting base 2, and the driving mechanism 3 simultaneously drives the mounting base 2 and the first deflection device 6 to move, so as to drive the target 7 to move at the first position and the second position. The vacuum chamber 5 is provided with a vacuum window 12 corresponding to the lower side of the specimen stage 9. An X-ray detector 11 is disposed below the vacuum window 12. The specimen stage 9 is connected to the vacuum chamber 5 through a lifting mechanism 10 so as to drive the specimen stage 9 to move up and down in the vacuum chamber 5.

As shown in FIG. 1, when the driving mechanism 3 drives the first deflection device 6 and the mounting base 2 so as to drive the target 7 to move to the second position, the function of detecting the specimen 8 by the Nano-CT is implemented.

Specifically, after the electron beams generated by the electron source 101 pass through the electron acceleration structure, the speed of movement is increased. The electron beams accelerated by the electron acceleration structure move downward after being focused by the objective lens system 103 and changing the direction of movement, the electronic optical column 1 emits scanning electron beams which pass through the first deflection device 6, the first deflection device 6 changes the direction of movement of the scanning electron beams, and then, the scanning electron beams are incident on the target 7. On the premise of ensuring that the beam spot of the electron beams acts on the target 7, the first deflection device 6 can adjust the incident angle of the scanning electron beam on the target 7 in a wide range. The electron beams act on the target 7 through scanning to generate X-rays, and the point at which the electron beams act on the target 7 is constantly changed, so as to avoid a high local temperature of the target 7, and prolong the service life of the target 7.

In some optional implementation manners, the mounting base 2 is provided with a cooling pipeline 4, a cooling liquid is introduced into the cooling pipeline 4, the cooling pipeline 4 is provided with a liquid inlet and a liquid outlet, the cooling liquid enters from the liquid inlet to take away the heat of the target 7 and then flows out from the liquid outlet, so as to facilitate heat dissipation of the target 7 to prolong the service life of the target 7.

The X-rays generated by the scanning electron beams acting on the target 7 irradiate the specimen 8 placed on the specimen stage 9. The specimen stage 9 is of a hollow structure, which meets the requirement of supporting the specimen 8 to be placed on the specimen stage 9, and also meets the transmission of the X-rays. Preferably, the specimen stage 9 is made of a material of aluminum or a metal with a low atomic number, such as magnesium.

In some optional implementation manners, an X-ray detector 11 may be disposed in the vacuum chamber 5 and disposed below the specimen stage 9.

Or, in some optional implementation manners, the vacuum chamber 5 is provided with a vacuum window 12 corresponding to the lower side of the specimen stage 9. An X-ray detector 11 is disposed below the vacuum window 12. The vacuum window 12 may be a beryllium window or a glass window.

The scanning electron beams emitted by the electronic optical column 1 can generate a beam spot with a very small diameter, so the X-ray microscope reaches the nano level. The detection of the specimen 8 by the Nano-CT is implemented.

As shown in FIG. 2, when the driving mechanism 3 drives the first deflection device 6 and the mounting base 2 so as to drive the target 7 to move to the first position, the function of detecting the specimen 8 by the SEM is implemented.

Specifically, after the electron beam generated by the electron source 101 passes through the electron acceleration structure, the speed of movement is increased. The electron beams accelerated by the electron acceleration structure move downward after being focused by the objective lens system 103 and changing the direction of movement, and the scanning electron beams emitted by the electronic optical column 1 act on the specimen 8. The electron beams act on the specimen 8 to generate secondary electrons, back scattered electrons, Auger electrons, cathode luminescence 5, X-rays, and the like. The function of detecting the specimen 8 by the SEM is implemented by using a corresponding electron detector or photon detector for detection.

In some optional implementation manners, the specimen stage 9 is connected to the vacuum chamber 5 through a lifting mechanism 10 so as to drive the specimen stage 9 to move up and down in the vacuum chamber 5.

In order to maintain a higher resolution of the SEM and ensure the imaging effect of the SEM, the lifting mechanism 10 can drive the specimen stage 9 to move up and down in the vacuum chamber 5, so as to drive the specimen 8 placed on the specimen stage 9 to move up and down in the vacuum chamber 5, thereby controlling the distance between the specimen 8 and the electronic optical column 1, that is, controlling the working distance of the SEM.

In some optional implementation manners, the lifting mechanism 10 may be a telescopic rod mechanism, or a hydraulic rod mechanism, or other mechanical structures which can drive the specimen stage 9 to move up and down.

In the microscope provided by the present disclosure, by disposing a movable target 7 between the electronic optical column 1 and the specimen stage 9, the scanning electron beams emitted by the electronic optical column 1 can selectively directly act on the specimen 8 or act on the target 7 to generate X-rays, and the generated X-rays irradiate the specimen 8. Through one-time mounting of the specimen, the microscope enables dual-function detection of the specimen, i.e., detection of the specimen by an SEM and detection of the specimen by a Nano-CT. Furthermore, the electron beams act on the target 7 through scanning, to generate X-rays, and the point at which the electron beams act on the target 7 is constantly changed, so as to avoid a high local temperature of the target 7, and prolong the service life of the target 7.

The above are only preferred embodiments of the present disclosure, and do not impose any formal restrictions on the present disclosure. Although the present disclosure has been disclosed as above with preferred embodiments, it is not intended to limit the present disclosure. Any technician familiar with this patent can make some changes or modifications into equivalent embodiments with equivalent changes by using the technical contents suggested above without departing from the scope of the technical solution of the present disclosure. Any simple amendments, equivalent changes, and modifications made to the above embodiments based on the technical essence of the present disclosure without departing from the contents of the technical solution of the present disclosure still fall within the scope of the solution of the present disclosure.

The invention claimed is:

1. A microscope, comprising:
an electronic optical column, configured to emit scanning electron beams;
a specimen stage, configured to place a specimen;
a target, movably disposed between the electronic optical column and the specimen stage;
a driving mechanism, configured to drive the target to move between a first position and a second position, wherein the first position is a position at which the electron beams act on the specimen, and the second position is a position at which the electron beams act on the target to generate X-rays irradiating the specimen;
a first deflection device, wherein the first deflection device is disposed between the electronic optical column and the target, and is configured to change a direction of movement of the electron beams before the electron beams are incident on the target; and
a mounting base, wherein the mounting base is provided with at least one mounting position, and each mounting position is configured to mount different targets;
wherein the first deflection device is connected to the mounting base, and the mounting base is connected to the driving mechanism.

2. The microscope of claim 1, wherein the mounting base is provided with a cooling pipeline configured to cool the target.

3. The microscope of claim 1, wherein an X-ray detector is disposed below the specimen stage.

4. The microscope of claim 1, wherein a lower end of the electronic optical column is connected with a vacuum chamber, the specimen stage is located in the vacuum chamber, and the specimen stage is disposed below the electronic optical column.

5. The microscope of claim 4, wherein the vacuum chamber is provided with a vacuum window corresponding to a lower side of the specimen stage.

6. The microscope of claim 5, wherein an X-ray detector is disposed below the vacuum window.

7. The microscope of claim 4, wherein the specimen stage is connected to the vacuum chamber through a lifting mechanism, so as to drive the specimen stage to move up and down in the vacuum chamber.

* * * * *